(12) United States Patent
Tu et al.

(10) Patent No.: US 11,171,463 B2
(45) Date of Patent: Nov. 9, 2021

(54) NARROW-LINEWIDTH TUNABLE EXTERNAL CAVITY LASER

(71) Applicant: InnoLight Technology (Suzhou) LTD., Jiangsu (CN)

(72) Inventors: Wenkai Tu, Jiangsu (CN); Jinan Gu, Jiangsu (CN); Liang Luo, Jiangsu (CN); Yuzhou Sun, Jiangsu (CN)

(73) Assignee: InnoLight Technology (Suzhou) Ltd., Suzhou (CN)

( * ) Notice: Subject to any disclaimer, the term of this patent is extended or adjusted under 35 U.S.C. 154(b) by 207 days.

(21) Appl. No.: 16/685,381

(22) Filed: Nov. 15, 2019

(65) Prior Publication Data
US 2020/0280170 A1    Sep. 3, 2020

(30) Foreign Application Priority Data
Nov. 12, 2018   (CN) .......................... 201821852082.2

(51) Int. Cl.
| | |
|---|---|
| *H01S 5/02325* | (2021.01) |
| *H01S 5/06* | (2006.01) |
| *H01S 5/065* | (2006.01) |
| *H01S 3/08* | (2006.01) |
| *H01S 5/10* | (2021.01) |
| *H01S 5/024* | (2006.01) |
| *H01S 5/14* | (2006.01) |
| *H01S 5/0687* | (2006.01) |
| *H01S 5/028* | (2006.01) |
| *H01S 5/00* | (2006.01) |

(52) U.S. Cl.
CPC ........ *H01S 3/08059* (2013.01); *H01S 5/0287* (2013.01); *H01S 5/02325* (2021.01); *H01S 5/02415* (2013.01); *H01S 5/02438* (2013.01); *H01S 5/0612* (2013.01); *H01S 5/0651* (2013.01); *H01S 5/0687* (2013.01); *H01S 5/1028* (2013.01); *H01S 5/1085* (2013.01); *H01S 5/141* (2013.01); *H01S 5/005* (2013.01)

(58) Field of Classification Search
CPC ............... H01S 5/02325; H01S 5/1085; H01S 5/02438; H01S 5/0612; H01S 5/1028; H01S 5/0651; H01S 5/02415; H01S 5/141; H01S 5/0687; H01S 5/0287
See application file for complete search history.

(56) References Cited

U.S. PATENT DOCUMENTS

| | | | |
|---|---|---|---|
| 9,207,516 B1 * | 12/2015 | Yu .......................... | G02F 1/216 |
| 2011/0033192 A1 * | 2/2011 | Daiber ................ | G02B 6/4215 |
| | | | 398/183 |

(Continued)

FOREIGN PATENT DOCUMENTS

| | | |
|---|---|---|
| CN | 105103389 A | 11/2015 |
| CN | 106663912 A | 5/2017 |

*Primary Examiner* — Yuanda Zhang
(74) *Attorney, Agent, or Firm* — Finnegan, Henderson, Farabow, Garrett & Dunner, LLP

(57) ABSTRACT

A narrow-linewidth tunable external cavity laser includes, sequentially arranged along an optical path, a laser gain chip, a collimating lens, a bandpass filter, a tunable filter, and an output cavity surface. The laser gain chip includes a first end surface and a second end surface positioned along the optical path. The first end surface is further away from the collimating lens and is coated with a highly reflective film to form an external cavity with the output cavity surface.

10 Claims, 3 Drawing Sheets

(56) References Cited

U.S. PATENT DOCUMENTS

| | | | |
|---|---|---|---|
| 2013/0177034 A1* | 7/2013 | Liu | H01S 3/10 372/20 |
| 2013/0343413 A1* | 12/2013 | Gao | H01S 3/0085 372/20 |
| 2015/0222090 A1* | 8/2015 | Piazza | H01S 5/141 372/20 |
| 2016/0056608 A1 | 2/2016 | Kim | |
| 2017/0155229 A1 | 6/2017 | Copner et al. | |

* cited by examiner

NARROW-LINEWIDTH TUNABLE EXTERNAL CAVITY LASER

CROSS-REFERENCE TO RELATED APPLICATION

This application is based upon and claims priority to Chinese Patent Application 201821852082.2, filed on Nov. 12, 2018, the entire content of which is incorporated herein by reference.

FIELD OF THE DISCLOSURE

The present disclosure relates to the field of laser technology and, more particularly, to a narrow-linewidth tunable external cavity laser.

BACKGROUND

Long-distance transmission has always been a major difficulty in the field of optical communication. The utilization of coherent optical communication can be a good solution to this problem. A wavelength tunable laser is a core part of a coherent transmitter, and a narrow linewidth of the tunable laser may be a good solution to the problem of long-distance transmission.

At the same time, the substantially increasing speed of information transmission requires increasingly small optical modules, thus requiring the package of the tunable laser to be smaller. For example, a tunable laser disclosed in Chinese Patent Application No. 201410059069.1, entitled "Small packaged tunable laser assembly", includes a rectangular housing, an electrical input interface, an optical output interface, a tunable semiconductor laser, a beam splitter, an optical isolator, a photodiode, and a coupling optical system. Here, the tunable semiconductor laser is an external cavity laser including a gain chip, a coupling system, and a tunable optical filter, the tunable optical filter including a Vernier tuning mechanism formed by two etalons, and the external cavity laser further including a cavity-long actuator disposed between the two etalons. Although the aforementioned structure realizes a tunable laser assembly in a small-size package, there are numerous optical interfaces in the tuning cavity, such as, for example, the optical interfaces of the coupling system, the two etalons, the cavity-long actuator, the laser cavity surface, the beam splitter, and an optical window. This results in greater optical loss. In addition, the numerous components make it impossible for the cavity length to be made any smaller, causing mode hopping to be more likely, and requiring a more complex mode locking system.

SUMMARY

Purposes of the present disclosure include providing a narrow-linewidth tunable external cavity laser that has a shorter cavity length, a stable cavity mode, and a decreased likelihood of mode hopping while also having few parts and little insertion loss.

In order to achieve one or more of the aforementioned purposes, the present disclosure provides a narrow-linewidth tunable external cavity laser including, sequentially arranged along an optical path, a laser gain chip, a collimating lens, a bandpass filter, a tunable filter, and an output cavity surface. The laser gain chip includes a first end surface and a second end surface positioned along the optical path; the first end surface being further away from the collimating lens relative to the second end surface and being coated with a highly reflective film. The output cavity surface and the first end surface of the laser gain chip form an external cavity for generating a plurality of laser modes. The tunable filter is a periodic filter that has a free spectral range (FSR) and a 3 dB peak bandwidth which is less than two times a space between two adjacent laser modes. A passband range of the bandpass filter is the same as a tuning range of the laser, and the passband range of the bandpass filter is greater than one time the FSR of the tunable filter and less than two times the FSR of the tunable filter to suppress laser modes outside its passband range.

DETAILED DESCRIPTION

Figure 1:
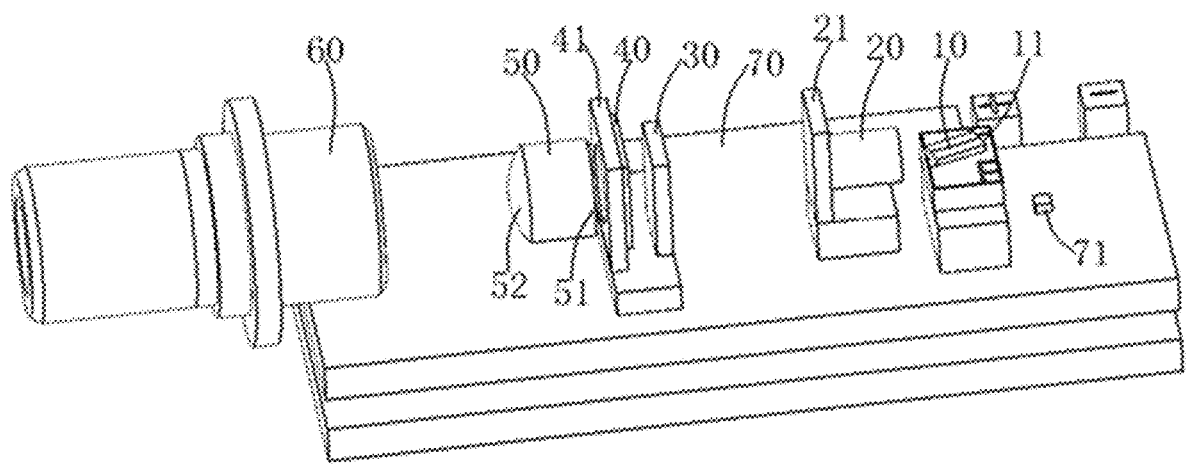
FIG. 1 is a diagram illustrating an external cavity laser according to a first example embodiment of the present disclosure.

The text below provides a detailed description of the present disclosure with reference to specific embodiments illustrated in the attached drawings. However, these embodiments do not limit the present disclosure; the scope of protection for the present disclosure covers changes made to the structure, method, or function by persons having ordinary skill in the art on the basis of these embodiments.

In order to facilitate the presentation of the drawings in the present disclosure, the sizes of certain structures or portions have been enlarged relative to other structures or portions; therefore, the drawings in the present disclosure are only for the purpose of illustrating the basic structure of the subject matter of the present disclosure.

Additionally, terms in the text indicating relative spatial position, such as "upper," "above," "lower," "below," and so forth, are used for explanatory purposes in describing the relationship between a unit or feature depicted in a drawing with another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (rotated 90 degrees or facing another direction), and descriptive terms that appear in the text and are related to space should be interpreted accordingly. When a component or layer is said to be "above" another part or layer or "connected to" another part or layer, it may be directly above the other part or layer or directly connected to the other part or layer, or there may be an intermediate component or layer.

Example Embodiment 1

Figure 2:
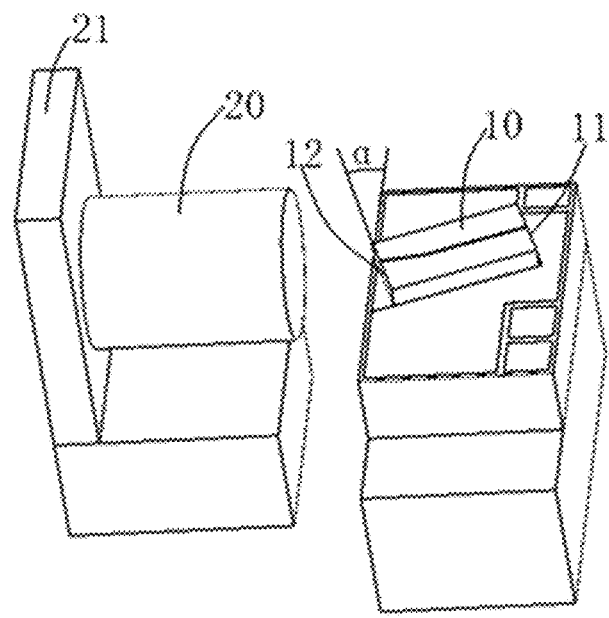
FIG. 2 is a diagram illustrating a combination of a laser gain chip with a collimating lens according to the first example embodiment.
Figure 3:
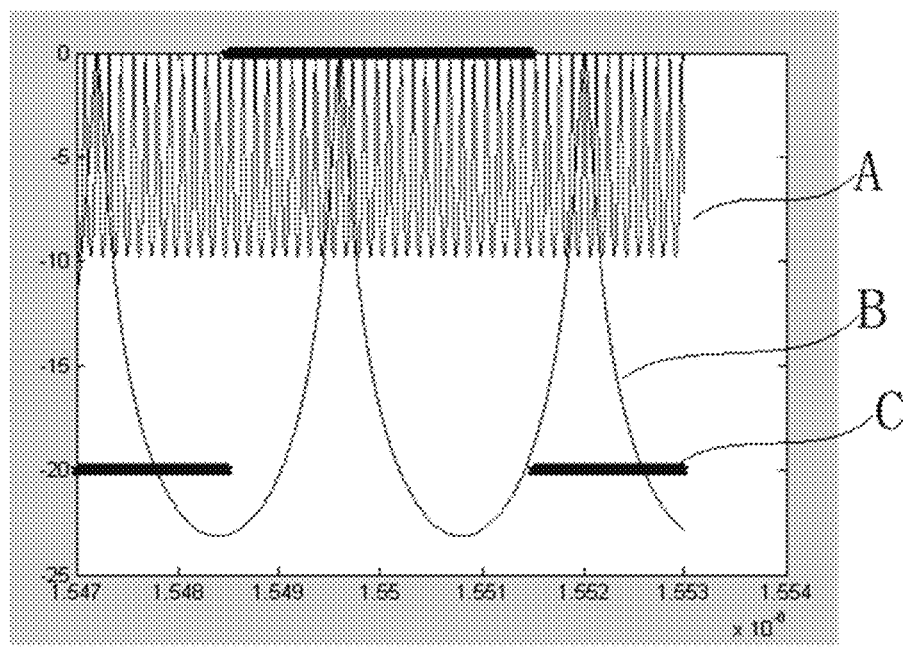
FIG. 3 is a diagram illustrating a mechanism of various spectrums of the external cavity laser according to the first example embodiment of the present disclosure.
Figure 4:
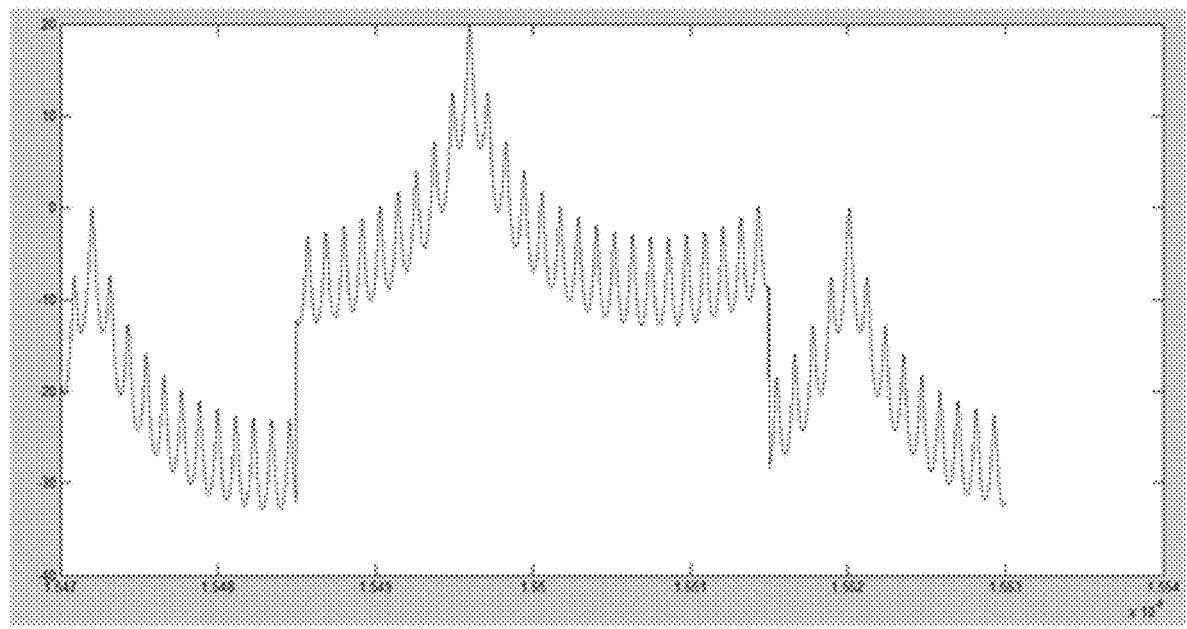
FIG. 4 is a diagram illustrating the spectrum outputted from the external cavity laser according to the first example embodiment of the present disclosure.

FIG. 1 is a diagram illustrating a narrow-linewidth tunable external cavity laser 100 according to a first example embodiment of the present disclosure. FIG. 2 is a diagram illustrating a combination of a laser gain chip with a collimating lens according to the first example embodiment. FIG. 3 is a diagram illustrating a mechanism of various spectrums of the external cavity laser 100 according to the first example embodiment of the present disclosure. FIG. 4 is a diagram illustrating the spectrum outputted from the external cavity laser 100 according to the first example embodiment of the present disclosure. As illustrated in FIGS. 1 through 4, the narrow-linewidth tunable external cavity laser 100 according to the first example embodiment includes, sequentially arranged along an optical path, a laser gain chip 10, a collimating lens 20, a bandpass filter 30, a tunable filter 40, and an output cavity surface. The output cavity surface is formed by a flat surface 51 of a coupling lens 50, which will be described in further detail below. Here, the laser gain chip 10 includes a first end surface 11 and a second end surface 12 positioned along the optical path. The first end surface 11 is further away from the collimating lens 20 relative to the second end surface 12, and is coated with a highly reflective film. The aforementioned output cavity surface and the first end surface 11 of the laser gain chip 10 form an external cavity that is used for generating a plurality of laser modes, as illustrated by a spectral curve A in FIG. 3. The collimating lens 20 is installed on a fixed block 21. The collimating lens 20 collimates a light beam transmitted from the laser gain chip 10 before the light beam enters the bandpass filter 30. The tunable filter 40 is a periodic filter having a free spectral range (FSR) and a 3 dB peak bandwidth D1. In this example embodiment, the tunable filter 40 uses a thermally tuned etalon. The laser 100 further includes a heater 41, the thermally tuned etalon being disposed on the heater 41 to allow for convenient tuning of the transmission peak position of the etalon by means of the heater 41. The transmission peak of the etalon has a very narrow line-width, as illustrated by a spectral curve B in FIG. 3. The 3 dB peak bandwidth of the transmission peak of the etalon is less than two times a space between two adjacent laser modes. A passband range of the bandpass filter 30 is the same as a tuning range of the tunable external cavity laser 100, as illustrated by a spectral curve C in FIG. 3. The passband range of the bandpass filter 30 is greater than one time the FSR of the tunable filter 40 and less than two times the FSR of the tunable filter 40 to suppress laser modes outside the passband range of the bandpass filter 30.

As illustrated in FIG. 3, only one transmission peak of the tunable filter 40 exists within the passband range of the aforementioned bandpass filter 30 by means of tuning the tunable filter 40. Then, within the passband range of the bandpass filter 30, the transmission peak of the tunable filter 40 is fine tuned to align with the laser mode, so that a maximum of only one laser mode is within the 3 dB range of the transmission peak at the same time. As illustrated in FIGS. 3 and 4, after the laser modes illustrated by the spectral curve A, the transmission spectrum illustrated by the spectral curve B of the tunable filter 40, and the spectrum of the bandpass filter 30 illustrated by the spectral curve C are superimposed, a narrow line-width laser peak value may be outputted to realize the narrow line-width tunable external cavity laser 100, the tuning range of the laser 100 being the same as the passband range of the bandpass filter 30. The combination of the tunable filter 40, which is a periodic filter, with the bandpass filter 30 enables tuning of the wavelength within a small range and makes the tuning simple. The number of parts in the external cavity are reduced, thereby lowering insertion loss and shortening cavity length. As a result, the length of the external cavity is decreased, the space between external cavity modes (i.e., laser modes) is increased, and the likelihood of mode hopping during wavelength locking is decreased.

In an optical module, the narrow-linewidth tunable external cavity laser 100 further includes the coupling lens 50 and an optical interface 60, the coupling lens 50 and the optical interface 60 being sequentially positioned along the optical path after the aforementioned tunable filter 40. Here, the coupling lens 50 includes the flat surface 51 and a convex surface 52 positioned along the optical path, the convex surface 52 being further away from the tunable filter 40 and the flat surface 51 being nearer to the tunable filter 40. The flat surface 51 is coated with a partially reflective film to form the aforementioned output cavity surface that is used for outputting laser light. The convex surface 52 is used for coupling the outputted laser light to the optical interface 60. In this example embodiment, the reflectance of the partially reflective film coated on the flat surface 51 is 10%. A reflectance greater than 10% or less than 10% may also be selected according to specific application needs. Coating the flat surface 51 at one end of the coupling lens 50 with a partially reflective film to form the output cavity surface of the external cavity eliminates the space of one cavity filter. Thus, the number of parts along the optical path is reduced, insertion loss is lowered, and the length of the external cavity is further shortened. As a result, the space between external cavity modes is increased, the likelihood of mode hopping during wavelength locking is decreased, and the realization of an optical module in a small-sized package is further facilitated.

In this example embodiment, the laser 100 further includes a heat sink 70 and a thermistor 71. The heat sink 70 includes a flat mounting surface, and the aforementioned thermistor 71, the laser gain chip 10, the collimating lens 20, the bandpass filter 30, and the tunable filter 40 are all disposed on the flat mounting surface of the heat sink 70. Here, the heat sink 70 uses a thermoelectric cooler (TEC). The thermistor 71 is arranged nearer to the laser gain chip 10. An external controller controls the temperature of the heat sink 70 based on feedback from the thermistor 71 to stabilize the external cavity mode (i.e., the laser mode). As described above, the tunable filter 40 uses a thermally tuned etalon and is disposed on the heater 41. The heater 41 is installed on the flat mounting surface of the heat sink 70 by means of a thermal insulation base, e.g., a glass base. As a result, the heater 41 is isolated from the influence of the heat sink 70 by means of the thermal insulation base.

As illustrated in FIG. 2, in order to prevent the second end surface 12 of the laser gain chip 10 from generating end-surface reflection to form an external cavity mode, the second end surface 12 of the laser gain chip 10 and an incidence plane of the collimating lens 20 have an angle of inclination $\alpha$ in this example embodiment. The angle of inclination $\alpha$ is greater than or equal to 19.5°.

Example Embodiment 2

Figure 5:
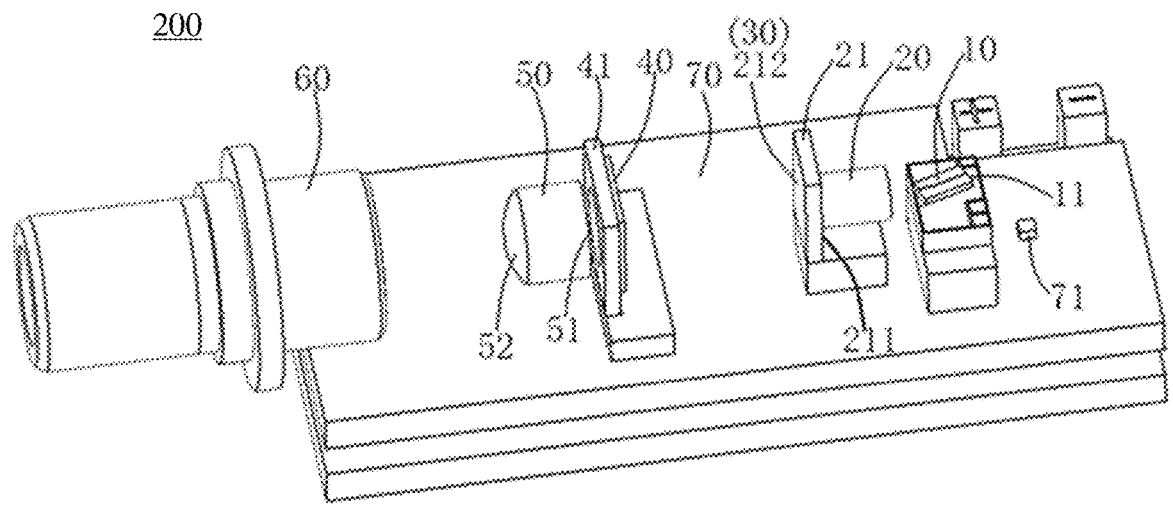
FIG. 5 is a diagram illustrating an external cavity laser according to a second example embodiment of the present disclosure.

FIG. 5 is a diagram illustrating an external cavity laser 200 according to a second example embodiment of the present disclosure. As illustrated in FIG. 5, the second example embodiment is the same as the first example embodiment in that the collimating lens 20 is installed on the fixed block 21. The fixed block 21 is an optically transparent block, e.g., a glass pane. The optically transparent block includes a third end surface 211 and a fourth end surface 212 positioned opposing each other along the optical path, and the collimating lens 20 is fixed on the third end surface 211. The second example embodiment differs from the first example embodiment as described below. The fourth end surface 212 is coated with a film to form a bandpass filter that can realize the function of the bandpass filter 30 in the first example embodiment. That is, the bandpass filter 30 in the first example embodiment is integrated onto the fixed block 21 of the collimating lens 20, thereby reducing the number of parts in the external cavity, saving more space, and further shortening the overall length of the external cavity.

Example Embodiment 3

Figure 6:
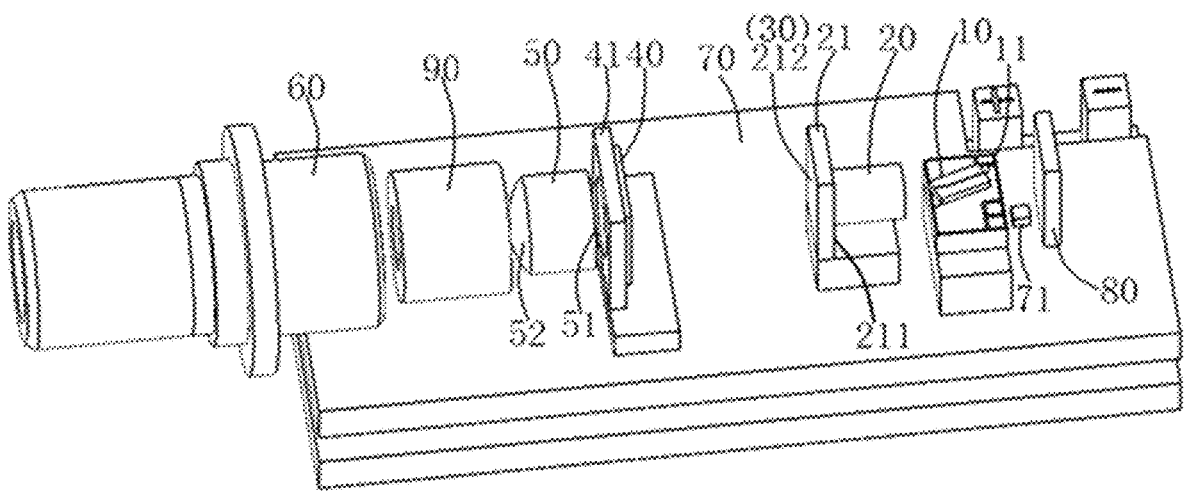
FIG. 6 is a diagram illustrating an external cavity laser according to a third example embodiment of the present disclosure.

FIG. 6 is a diagram illustrating an external cavity laser 300 according to a third example embodiment of the present disclosure. As illustrated in FIG. 6, the third example embodiment differs from example the first and second example embodiments in that the external cavity laser 300 further includes a monitor photo detector 80. An optical receiving surface of the monitor photo detector 80 is arranged to face the first end surface 11 of the laser gain chip 10. The reflectance of the highly reflective film coated on the first end surface 11 of the laser gain chip 10 is greater than or equal to 90%. A very small portion of the laser light (e.g., 10% of the laser light) propagating in the external cavity is outputted from the first end surface 11 and is received by the aforementioned monitor photo detector 80 to be used for monitoring the output optical power from the tunable external cavity laser 300.

In each of the aforementioned example embodiments, an isolator 90 may further be added along the optical path between the coupling lens 50 and the optical interface 60 to isolate the light traveling in the backward direction that returns from the optical interface 60. This prevents the externally reflected returning light from entering the external cavity, generating other side modes, and influencing the stability of the laser mode. The isolator 90 may also be integrated onto the optical interface 60 to reduce the overall length of the parts, thereby facilitating the realization of an optical module in a small-sized package.

A wavelength locking module may further be added in the external cavity to accurately lock the wavelength of the external cavity laser. An anti-reflective film may be coated on a transmission surface of any of the parts in the external cavity, for example, the second end surface 12 of the laser gain chip 10, the two transmission surfaces of the collimating lens 20, or the third end surface 211 of the fixed block 21 of the collimating lens 20.

The embodiments of the present disclosure have the following benefits. The combination of an etalon with a bandpass filter enables the tuning of the wavelength within a small range. The number of parts in the external cavity are reduced, thereby lowering insertion loss and shortening cavity length. As a result, the space between external cavity modes is increased, and the likelihood of mode hopping is decreased during wavelength locking.

The series of detailed descriptions above is only intended to provide specific descriptions of feasible embodiments of the present disclosure. They are not to be construed as limiting the scope of protection for the present disclosure; all equivalent embodiments or changes that are not detached from the techniques of the present disclosure in essence should fall under the scope of protection of the present disclosure.

What is claimed is:

1. A narrow-linewidth tunable external cavity laser, comprising:
    a laser gain chip, a collimating lens, a bandpass filter, a tunable filter, and an output cavity surface sequentially arranged along an optical path,
    wherein the laser gain chip comprises a first end surface and a second end surface positioned along the optical path, the first end surface being further away from the collimating lens relative to the second end surface and being coated with a highly reflective film,
    the output cavity surface and the first end surface of the laser gain chip form an external cavity for generating a plurality of laser modes,
    the tunable filter is a periodic filter that has a free spectral range (FSR) and a 3 dB peak bandwidth which is less than two times a space between two adjacent laser modes; and
    a passband range of the bandpass filter is the same as a tuning range of the laser, and the passband range of the bandpass filter is greater than one time the FSR of the tunable filter and less than two times the FSR of the tunable filter to suppress laser modes outside the passband range of the bandpass filter.

2. The narrow-linewidth tunable external cavity laser of claim 1, wherein the collimating lens is installed on a fixed block, the fixed block being an optically transparent block comprising a third end surface and a fourth end surface positioned opposing each other along the optical path, the collimating lens being fixed on the third end surface, and the fourth end surface being coated with a film to form the bandpass filter.

3. The narrow-linewidth tunable external cavity laser of claim 1, further comprising a coupling lens and an optical interface sequentially positioned along the optical path after the tunable filter,
    wherein the coupling lens comprises a flat surface and a convex surface positioned along the optical path, the convex surface being further away from the tunable filter and the flat surface being nearer to the tunable filter, and
    the flat surface is coated with a partially reflective film to form the output cavity surface that is used for outputting laser light, and the convex surface is used for coupling the outputted laser light to the optical interface.

4. The narrow-linewidth tunable external cavity laser of claim 3, wherein the tunable filter is a thermally tuned etalon, and the laser further comprises a heater, the thermally tuned etalon being disposed on the heater.

5. The narrow-linewidth tunable external cavity laser of claim 1, wherein the second end surface of the laser gain chip and an incidence plane of the collimating lens have an angle of inclination.

6. The narrow-linewidth tunable external cavity laser of claim 5, wherein the angle of inclination is greater than or equal to 19.5°.

7. The narrow-linewidth tunable external cavity laser of claim 1, further comprising a monitor photo detector, an optical receiving surface of the monitor photo detector being arranged to face the first end surface of the laser gain chip.

8. The narrow-linewidth tunable external cavity laser of claim 7, wherein the reflectance of the highly reflective film coated on the first end surface is greater than or equal to 90%.

9. The narrow-linewidth tunable external cavity laser of claim 1, further comprising a heat sink and a thermistor,
wherein the heat sink comprises a flat mounting surface, and the thermistor, laser gain chip, collimating lens, bandpass filter, and tunable filter are all disposed on the flat mounting surface of the heat sink, the thermistor being arranged nearer to the laser gain chip.

10. The narrow-linewidth tunable external cavity laser of claim 3, further comprising an isolator, the isolator being disposed along the optical path between the coupling lens and the optical interface.

\* \* \* \* \*